United States Patent [19]

Markle

[11] Patent Number: 4,549,084
[45] Date of Patent: Oct. 22, 1985

[54] ALIGNMENT AND FOCUSING SYSTEM FOR A SCANNING MASK ALIGNER

[75] Inventor: David A. Markle, Norwalk, Conn.

[73] Assignee: The Perkin-Elmer Corporation, Norwalk, Conn.

[21] Appl. No.: 451,900

[22] Filed: Dec. 21, 1982

[51] Int. Cl.$^4$ .............................................. G01H 21/86
[52] U.S. Cl. ..................... 250/548; 250/557; 356/400
[58] Field of Search ............... 250/548, 557, 237 G, 250/201, 204; 356/138, 400, 401, 396, 4; 354/403

[56] References Cited

U.S. PATENT DOCUMENTS

| | | | |
|---|---|---|---|
| 3,957,364 | 5/1976 | Markle et al. | 353/28 |
| 4,037,969 | 7/1977 | Feldman et al. | 356/172 |
| 4,202,627 | 5/1980 | Suzuki | 250/548 |
| 4,252,442 | 2/1981 | Dandliker et al. | 250/548 |
| 4,301,363 | 11/1981 | Suzuki et al. | 250/216 |
| 4,326,805 | 4/1982 | Feldman et al. | 356/399 |
| 4,353,087 | 10/1982 | Berry et al. | 356/138 |
| 4,371,264 | 2/1983 | Lacombat et al. | 250/237 G |
| 4,395,117 | 7/1983 | Suzuki | 250/557 |
| 4,441,250 | 4/1984 | Imahashi | 250/237 G |

Primary Examiner—David C. Nelms
Assistant Examiner—J. Gatto
Attorney, Agent, or Firm—Thomas P. Murphy; Edwin T. Grimes; Francis L. Masselle

[57] ABSTRACT

The present invention is directed to an improvement in an alignment system for a scanning mask aligner employing a pattern on the mask or the wafer or both in the scribe lines that run in the direction of scanning, the improvement comprising a viewing system having optical grids, a system for moving the patterns across the optical grids in the viewing system, the grids corresponding to the directions and spacings of the patterns so that light transmitted through the grid is strongly modulated, and circuitry for comparing the phase modulation from the mask and wafer alignment targets to obtain alignment error signals; further according to the invention, the same system used to measure alignment can also be used to measure how well the mask is focused on the wafer. In this case two images of the mask pattern are arranged so that one is slightly inside of focus and the other is slightly outside of focus, and by comparing the amount of modulation on the two channels it is possible to deduce which of the two is closer to focus and therefore how to shift the focus so that they are equal.

18 Claims, 5 Drawing Figures

ALIGNMENT AND FOCUSING SYSTEM FOR A SCANNING MASK ALIGNER

FIELD OF INVENTION

This invention relates to the field of microlithography and, more particularly, to alignment and/or focusing systems for scanning mask aligners. The system according to the present invention is particularly adapted, among other possible uses, for use with a step and scan microlithography projection system.

BACKGROUND OF THE INVENTION

In the making of micro-circuits the general process followed is that of generating an oxide film on the semiconductor substrate; coating the oxide film with a photoresist and then illuminating the photoresist through a mask to expose selected portions of the resist. After exposure, the photoresist is developed, etched and further processed. Once this is done the same steps are repeated a number of times. The exposure pattern on the photoresist is determined by masks which are prepared for the purpose. Separate masks are used for each of the successive steps. If everything is to appear in the proper place on the micro-circuit a high degree of alignment is necessary between steps. Typical alignment systems employed heretofore are described in U.S. Pat. Nos. 3,975,364; 4,011,011; 4,006,645 and U.S. patent application Ser. No. 19,964, for example.

Almost all the current automatic alignment systems require that the mask and wafer be essentially fixed with respect to the alignment system during the alignment process. This is no problem in a step-and-repeat type system, but it is far from ideal in a scanning projection printer since misregistration can occur when the mask and wafer move with respect to the projection system. Furthermore, better alignment is achieved if the alignment is done continuously during scanning and exposure, rather than at a single place over the scan field. Not only does this eliminate the time lost during static alignments thereby increasing throughput, but it will do a better job, especially on large subfields. Further, the system provides a high signal-to-noise ratio even with a moderately high alignment system bandwidth.

Most focusing systems are indirect and bring the wafer to a fixed location. Thermal changes in the projection system which cause the best focus location to move are not accommodated by indirect systems. The system according to the present invention is direct, is ideally suited for a scanning system, and does not require any vibrating or oscillatory motions that could degrade system performance. A direct working system is very important if a glass cover is used to protect the mask since such covers could be expected to have a considerable variation in thickness requiring a different focus setting for each mask.

While a number of different types of alignment and/or focusing systems have been employed heretofore with moderate success, my contribution to the art is a new system, which is an improvement over such prior art systems, as will become apparent as the description proceeds.

SUMMARY OF THE INVENTION

In order to accomplish the desired results, the invention provides, in one form thereof, a new and improved alignment system for a scanning mask aligner employing a continuous pattern on both the mask and wafer in the scribe lines that run in the direction of scan, the combination comprising a viewing system having optical grid means, means for moving the patterns across the optical grid means in the viewing system, the grid means corresponding to the directions and spacings of the patterns so that light transmitted through the grid means is strongly modulated. The system further comprises means for comparing the phase modulation from the mask and wafer alignment targets to obtain alignment error signals. According to one aspect of the invention the mask and wafer patterns may, for example, be a diamond-shaped pattern. The system may be used with many different forms of illumination such as bright field, dark field or Nomarske phase contrast, for example. According to an aspect of the invention the optical grid means includes a pair of orthogonally disposed optical grids, one being deposed plus about 45° and the other minus about 45° with respect to the scanning direction.

According to a further aspect of the invention the means for comparing the phase modulation includes different detectors on which the mask and wafer patterns are imaged. In fact a detector array comprising a plurality of independent detectors can be used so that a number of alternate positions for the mask and wafer patterns is available in each scribe line.

Many of the components of the alignment system are also compatible with a continuous focusing system. In this case two images of the mask pattern are arranged so that one is slightly inside of focus and the other is slightly outside of focus, and by comparing the amount of modulation on the two channels it is possible to deduce which of the two is closer to focus and therefore how to shift the focus so that they are equal.

There has thus been outlined rather broadly the more important features of the invention in order that the detailed description thereof that follows may be better understood, and in order that the present contribution to the art may be better appreciated. There are, of course, additional features of the invention that will be described hereinafter which will form the subject of the claims appended thereto. Those skilled in the art will appreciate that the conception upon which the disclosure is based may be readily utilized as a basis for the designing of other systems for carrying out the several purposes of the invention. It is important, therefore, that the claims be regarded as including such equivalent systems as do not depart from the spirit and scope of the invention.

Specific embodiments of the invention have been chosen for purposes of illustration and description, and are shown in the accompanying drawings, forming a part of this specification.

DETAILED DESCRIPTION OF THE INVENTION

Figure 1:
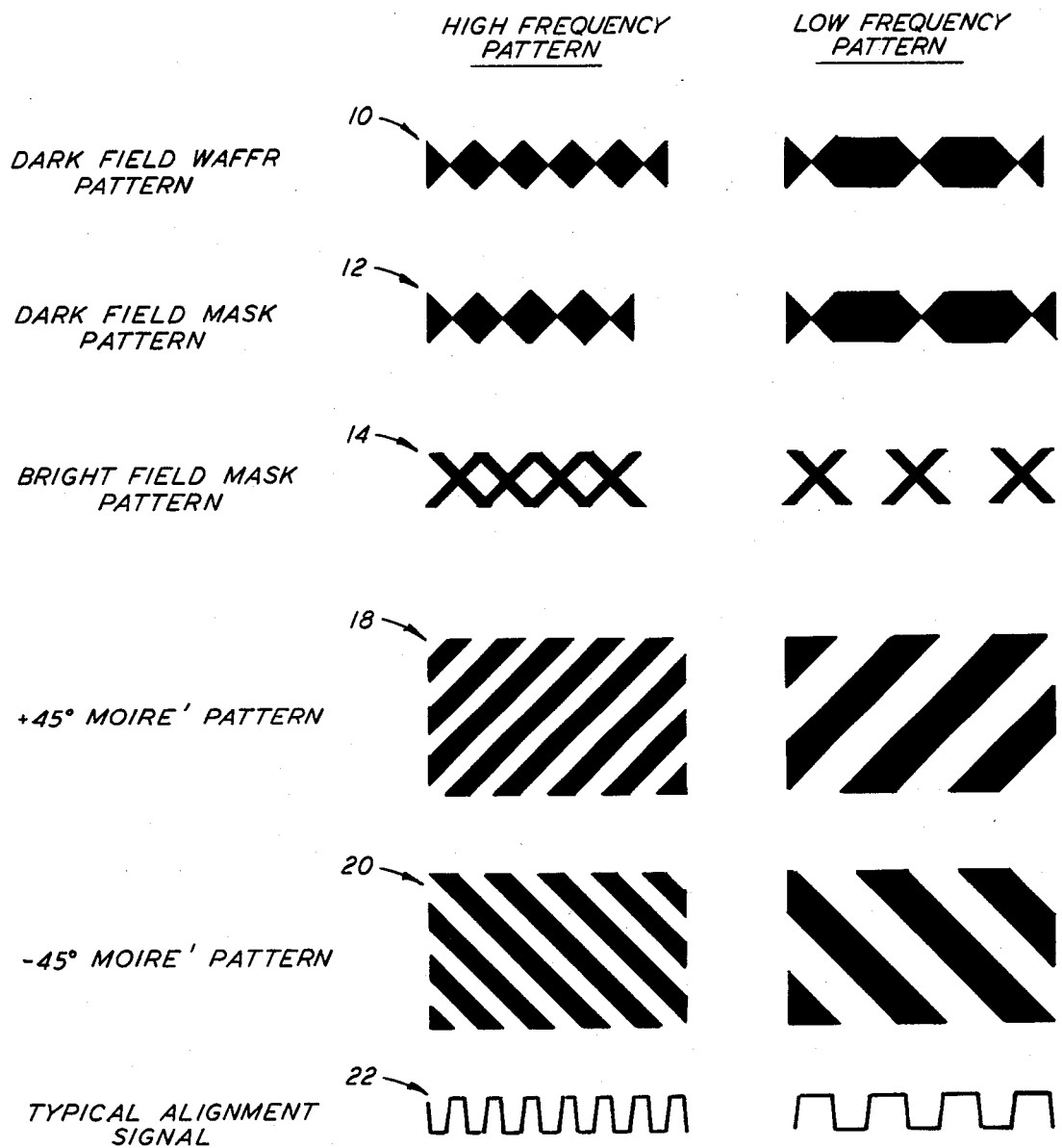
FIG. 1 is a view of several mask, wafer, grid and signal patterns according to the invention.

In the embodiments of the invention illustrated, the alignment targets are continuous diamond patterns contained in the mask and wafer scribe alleys or lines, which run parallel to the scanning direction. FIG. 1 shows a low frequency and a high frequency pattern either of which can be put on the mask or in the wafer scribe alley for alignment. The wafer pattern can, for example, be either raised or recessed diamonds as indicated at 10, which when dark field illuminated will have edges appearing as bright lines on a dark background. If dark field illumination is also used on the mask, as indicated at 12, then the mask pattern can be either opaque or clear with only the edges being visible in the viewing system in either case. In general, the mask signal is substantially weaker than the wafer signal because the pattern edges are thinner and steeper than their wafer counterparts and therefore scatter less light into the viewing system. The mask pattern signal can be substantially increased by employing bright field illumination as indicated at 14, and a pattern consisting of narrow slots in an opaque background. The slots are positioned to correspond to the edge positions in the dark field mask pattern. An important feature of both the mask and wafer patterns is that they remain centered whether or not they are over or under etched.

Figure 3:
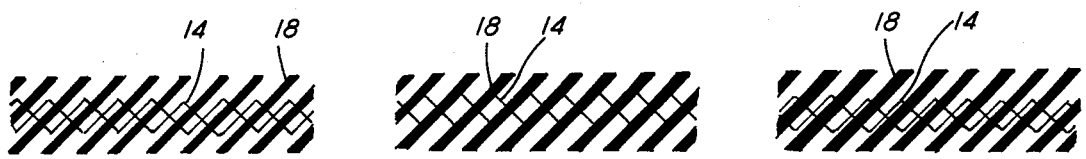
FIG. 3 is a view showing successive relative positions of the grid and alignment pattern showing how light from the edges of the wafer pattern is modulated by a grating of similar orientation.
Figure 2:
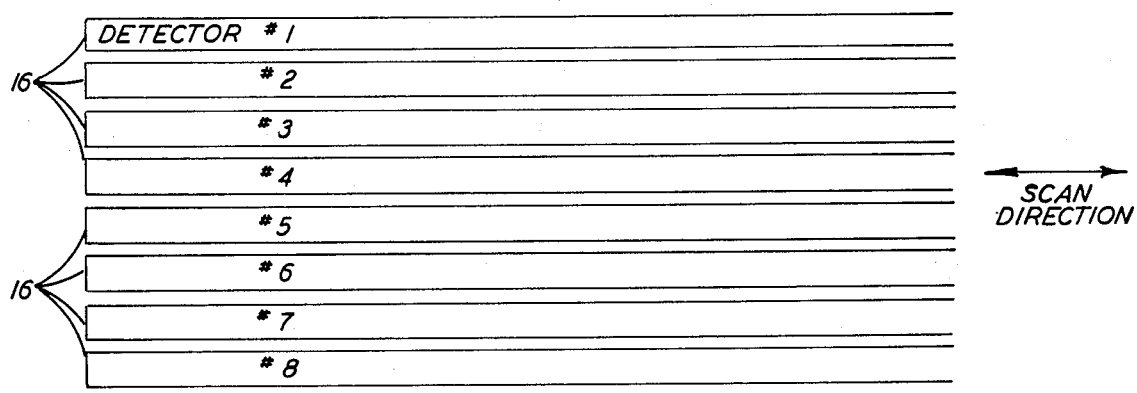
FIG. 2 is a plan view of a detector array on which the mask and wafer patterns are imaged.

The size of the alignment patterns referred to the wafer can be varied to suit the application, but might typically be five or ten microns across so that there is room for about ten patterns or tracks in a scribe line, as the scribe lines are typically 4 or 5 mils wide. One possibility is to switch the track containing the mask and wafer alignment pattern with each masking step. This involves switching between the different detectors monitoring each track as indicated at 16 at FIG. 2. The width of each detector might correspond to about 10 microns on the wafer and the length could be as long as the width of the zone of good correction in the projection system. In fact, there are two detector arrays which view identical portions of the mask and wafer via a beam splitter, as will be discussed more fully hereinafter. Optically superimposed on each detector array is an optical grid consisting of regularly spaced clear and opaque lines corresponding to the spacing of the alignment target edges. One grid has lines slanting to the right as indicated at 18, FIG. 1, and the other to the left as indicated at 20, FIG. 1. The scanning operation moves the alignment patterns across the grids producing a strongly modulated signal on the corresponding detectors. FIG. 3 shows the relative positions of the grid and alignment pattern illustrating how light from the edges of the wafer pattern is modulated by a grating of similar orientation. The resulting signals, as indicated at 22 in FIG. 1, have a periodicity equal to the mask and wafer alignment patterns. The maximum acquisition range is therefore equal to plus or minus one-half the alignment pattern period. A nine micron period alignment pattern thus provides a ±4.5 micron maximum acquistion range. The low frequency pattern shown in FIG. 1 illustrates how the periodicity can be modified without increasing the width of the pattern. In general, acquisition range can be traded for signal-to-noise ratio and alignment accuracy. Since the alignment pattern can be viewed over the width of the projection system's slit, possibly 1.5 to 2.0 mm, and this encompasses a lot of edges, it may be possible to have a large signal-to-noise ratio as well as a large acquisiton range.

Figure 4:
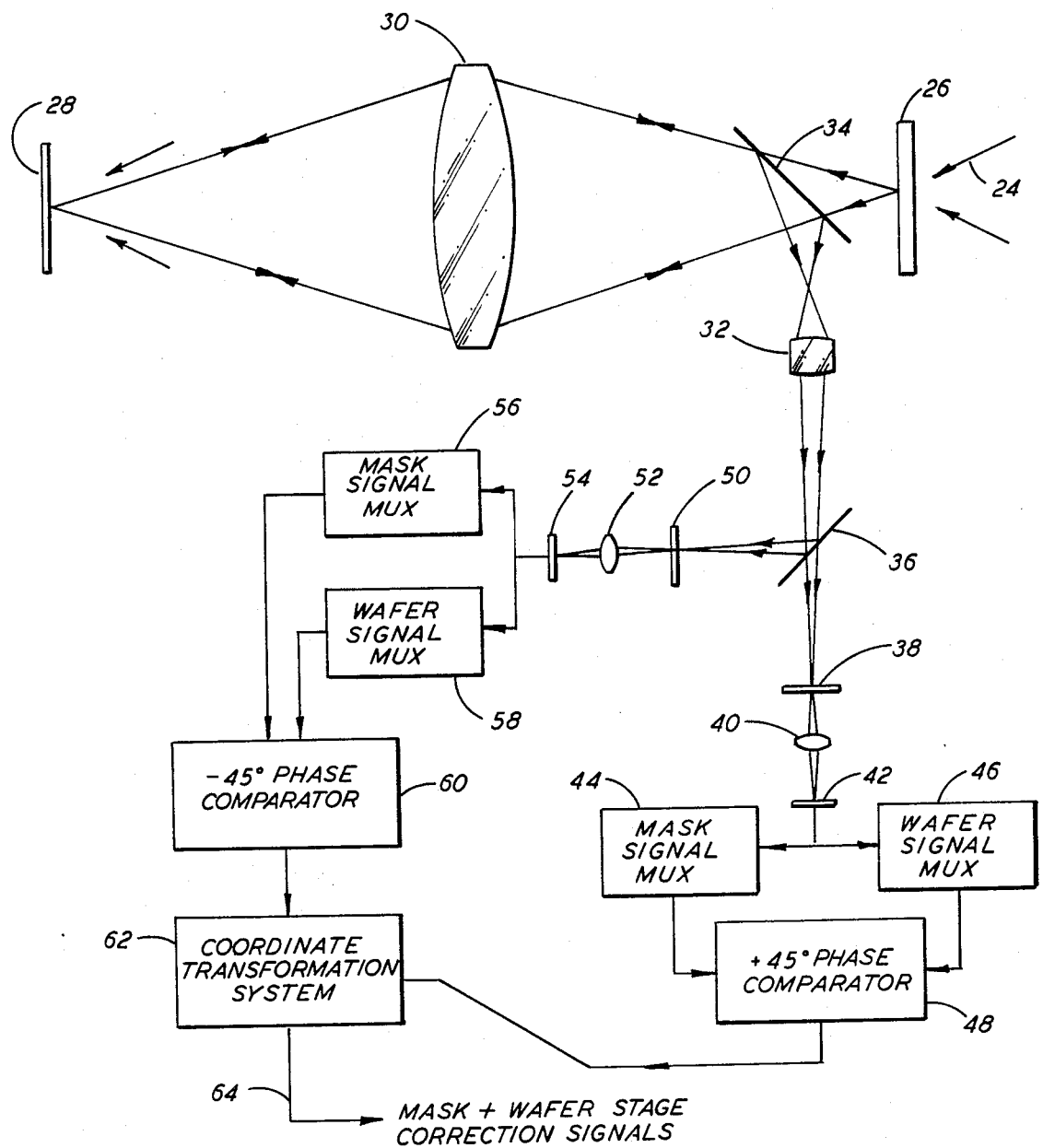
FIG. 4 is a schematic diagram showing a projection system and an alignment system according to the invention.

A schematic representation of the alignment system is shown in FIG. 4, wherein dark field mask illumination, indicated at 24, is focused on a mask 26. The mask pattern is imaged on a wafer 28, by a projection system indicated generally at 30, which includes lens means. The wafer acts as a mirror of the mask image so that the mask is reimaged and the wafer is imaged into the focal plane of a relay lens means, 32, via a beam splitter 34 in the projection system. A second beam splitter 36 behind the relay lens splits the relayed image into two components so that two grids can be used, one oriented at +45° and the other at −45°. Thus, one component includes a +45° grid 38, a lens system 40 and a detector array 42. The appropriate detector to sense the mask and wafer signals is selected by a multiplexor, i.e., a mask signal MUX 44 or a wafer signal MUX 46. From there the modulated signals are fed into a +45° phase comparator 48. The other component from the beam splitter 36 is reflected to a −45° Moire grid 50, a lens system 52, and a detector array 54. The appropriate detector to sense the mask and wafer signals is selected by a multiplexor, i.e., a mask signal MUX 56 or a wafer signal MUX 58. From there the modulated signal is fed into a −45° phase comparator 60. The outputs from the two phase comparators, 48, 60 correspond to alignment errors in the directions normal to the corresponding optical grid ±45°. These signals are readily converted into X and Y or 0° and 90° alignment signals in a coordinate transformation system 62, which outputs mask and wafer stage correction signals 64. Scanning the mask and wafer relative to the projection and viewing systems generates an alternating signal 22, FIG. 1, in each detector array. The relative phase between mask and wafer signals is a measure of their alignment in a direction orthogonal to the pattern lines. Since there are grid patterns which are mutually orthogonal the alignment signals can be algebraically combined to correspond to any desired coordinate systems such as X & Y, etc.

The size of the alignment pattern on the wafer is limited by the spacing between chips and the number of different alignment patterns made necessary either because earlier patterns are degraded by subsequent wafer processing or because a particular critical alignment requires that one layer be aligned directly rather than both layers to a third layer. There is no need to print the mask pattern, and in fact, it would be very desirable to avoid it. Where printing the mask pattern is unavoidable, this should be done on a reasonably clean portion of the wafer. If attempts are made to superimpose the mask and wafer patterns so that their edges are coincident, then alignment errors might occur because of the light lost after being diffracted out of the projection system aperture by the sloping edges of the wafer topography. For the same reason it is probably not a good idea to superimpose successive mask patterns either if the masks pattern is printed. As a result, $2(n-1)$ possible mask and wafer target positions are required between lines where n is the number of layers and $(n-1)$ the number of alignments. If the signal processing electronics and mask layout rules are arranged so that the mask signal is always 180° out of phase with the wafer signal, then the mask target can be superimposed on previously used wafer targets and the number of target positions reduced to $n-1$ provided a new wafer target is laid down each step. If the electronics and mask layout rules are modified so that the phase between the mask and wafer signals may be either 0° or 180°, then the number of target positions can be as small as (n+m)/2 where m is the number of wafer target positions. This option opens the way for an operator induced error if the relative phase is inputted incorrectly, but it reduces the number of tracts to 8 taking a worst case where n=12, m=4 situation. This permits each alignment pattern to be 8 or 9 microns wide.

In the event that printing the mask target can be avoided by removing the ultraviolet component from the scribe line illumination, then only a few tracks are required such as, for example, one for the mask and a few for the wafer, depending on how well the wafer pattern stands up under the various process steps.

The simplest way to use this alignment system is to try to keep the alignment track as close to the center of the projection field as possible. This minimizes the effects of skew and magnification and presents no problem as long as the width of the projection system field, 20 or 25 mm., is at least twice as wide as the chip size so that at least two rows of chips can be included on the mask. Magnification in the slit direction can be inferred indirectly by measuring the magnification along the scan direction. Adjusting the magnification in the scan direction should also correct it in the other direction assuming isotropic changes in the wafer. Skew is caused by lateral misalignment in the projection system and can probably be controlled by periodic checking with special masks or wafers.

There is also the possibility of putting two alignment tracks on each mask; one at the top and one at the bottom. With this arrangement a total of four alignment signals are derived which can be used to control X and Y alignment, magnification along the slit, and skew. Skew can be adjusted either by a lateral motion of one of the projection system elements or by rotating the mask with respect to the wafer. Magnification along the slit adjustment can probably be obtained by axial motion of one of the projection system refractive components. Instead of correcting skew and magnification along the slit the effects can be minimized by balancing the runout at the top and bottom of the field.

Figure 5:
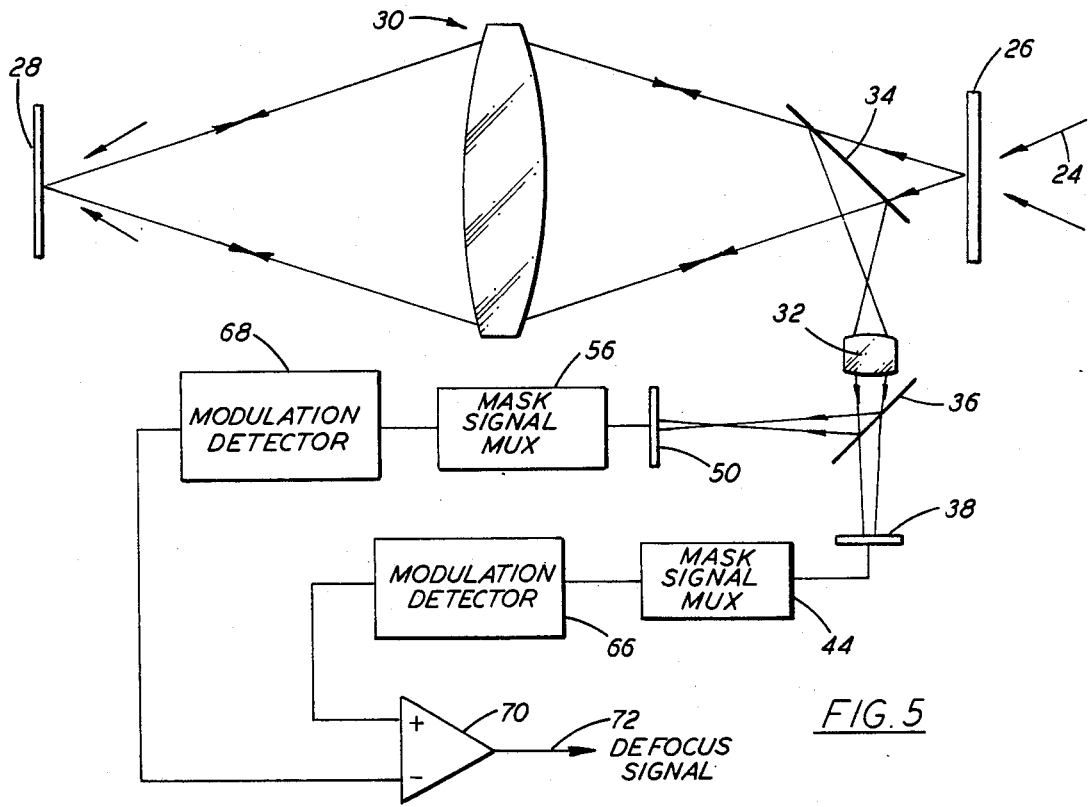
FIG. 5 is a schematic diagram showing a focus sensing system according to the invention.

By making a few small changes, the same system used to measure alignment can also be used to measure how well the mask is focused on the wafer. The required changes are shown in FIG. 5. The +45° pattern grid has been shifted slightly inside the normal focus and the −45° pattern grid slightly outside of focus. The focus of the mask on the wafer is determined by measuring the relative modulation amplitude of either the mask or wafer targets on the inside focus and outside focus detectors. Since the viewing relay can be situated physically close to the mask image plane, the relayed focus conjugates should accurately represent the mask position. However, it is possible to separate projection system focus errors from relay system errors by deriving both mask and wafer target focus errors. The target error is proportional to the projection system error plus the viewing relay error whereas the mask target error is proportional to twice the projection system focus error plus the viewing relay focus errors. Still referring to FIG. 5, a mask pattern modulation detector, 66, is disposed behind the mask signal MUX 44 and a second mask pattern modulation detector 68, is disposed behind the mask signal MUX 56. Subtracting the inside and outside focus modulations yields a signal indicating the sign and magnitude of the amount of defocus for small focus errors. The operation performed by the modulation detectors is to provide a signal porportional to the modulation. If the maximum and minimum signal levels are Vmax and Vmin, then:

$$\text{Modulation} = \frac{V\text{max} - V\text{min}}{V\text{max} + V\text{min}}$$

The two modulation signals are subtracted by an operational amplifier 70 to output a defocus signal 72. If the mask is correctly focused on the wafer, then the modulation amplitude should be the same on both mask pattern modulation detectors and the difference should be zero.

If the mask is out of focus, then the modulation levels will be different and a defocus signal will be generated.

It will thus be seen that the present invention does indeed provide an improved alignment and/or focusing system which effectively meets the objects specified hereinbefore. Although specific embodiments have been illustrated and described, it will be obvious to those skilled in the art that various modifications may be made without departing from the spirit and scope of the invention which is to be limited solely by the appended claims.

What is claimed is:

1. In an alignment-system for a scanning mask aligner employing a pattern on the mask and the wafer in the scribe lines that run in the direction of scan, the combination comprising:
   a. viewing system having optical grid means;
   means for moving the patterns across said optical grid means in the viewing system, the grid means corresponding to the directions and spacings of the patterns so that light transmitted through the grid means is modulated; and
   means for comparing the phase modulation from the mask and wafer alignment targets to obtain alignment error signals.

2. The system according to claim 1 wherein said pattern is a diamond-shaped pattern.

3. The system of claim 1 wherein said patterns are illuminated with dark field illumination.

4. The system of claim 1 wherein said patterns are illuminated with bright field illumination.

5. The system according to claim 1 wherein said means for moving the patterns is the scanning operation means.

6. The system of claim 1 wherein said optical grid means includes a pair of orthogonally disposed optical grids.

7. The system according to claim 1 wherein said optical grid means includes a first grid having about a plus 45° pattern and a second grid having about a minus 45° pattern with respect to the scanning direction.

8. The system according to claim 1 wherein said means for obtaining the phase modulation includes multiple detectors on which the mask and wafer patterns are imaged, separately.

9. In an alignment system for a scanning mask aligner employing a continuous pattern on both the mask and wafer in the scribe lines that run in the direction of scan, the combination comprising means for mounting said mask in spaced relationship with respect to said wafer, a projection system interposed between said mask and wafer including a first beam splitter so that the mask pattern is imaged on the wafer by said projection system and the wafer acts as a mirror of the mask image so that the mask is reimaged and the wafer is imaged into the focal plane of viewing relay means via said beam splitter, a second beam splitter behind said relay means for splitting the relayed images into two components, a detector array, grid means, multiplexor, and phase comparator for each component, the detectors sensing the mask and wafer signals selected by the multiplexor which feeds the modulated signal into the phase comparator, coordinate transformation means for receiving the outputs from the phase comparators and outputting mask and wafer stage correction signals.

10. The system according to claim 9 wherein one of said grid means has of the order of about a plus 45° Moire pattern and the other of said grid means has of the order of about a minus 45° Moire pattern.

11. In a focusing system for a scanning mask aligner employing a pattern on the mask and the wafer in the scribe lines that run in the direction of scan, the combination comprising a viewing system having optical grid means, means for moving the patterns across said optical grid means in the viewing system, the grid means corresponding to the direction and spacing of the patterns so that light transmitted is modulated, means for arranging one image of the mask pattern so that it is inside of focus, means for arranging a second image of the mask pattern so that it is outside of focus, means for comparing the amount of modulation of said images to output a defocus signal.

12. In a focusing system for a scanning mask aligner employing a pattern on the mask and the wafer in the scribe lines that run in the direction of scan, the combination comprising a viewing system having a pair of optical grids, means for moving the patterns across said optical grids in the viewing system, the grids corresponding to the direction and spacing of the patterns so that light transmitted is modulated, one of said grids having a pattern orthogonally disposed with respect to the other of said grids, one of said grids being mounted so the pattern moving thereacross is inside nominal focus, a modulation detector for each grid and means for comparing the output of said modulation detectors to output a defocus signal.

13. The system according to claim 12 wherein said pattern is a diamond-shaped pattern.

14. The system of claim 12 wherein said wafer pattern is dark field illuminated.

15. The system of claim 12 wherein said mask pattern is dark field illuminated.

16. The system of claim 12 wherein said mask pattern is bright field illuminated.

17. The system according to claim 12 wherein said optical grid means includes a first grid having lines and spaces oriented at about plus 45° to this scan direction and a second grid having lines and spaces oriented at about a minus 45° to the scan direction.

18. In a focusing system for a scanning mask aligner employing a continuous pattern on the mask and the wafer in the scribe lines that run in the direction of scanning, the combination comprising:

means for mounting said mask in spaced relationship with respect to said wafer, a projection system interposed between said mask and wafer including a first beam splitter so that the mask pattern is imaged on the wafer by said projection system and the wafer acts as a mirror of the mask image so that the mask is reimaged and the wafer is imaged into the focal plane of a viewing relay lens means via a first beam splitter, a second beam splitter behind said relay lens means for splitting the relay image into two components, a grid means, multiplexor, and modulation detector for each component, one of said grid means being mounted so the pattern moving thereacross is inside nominal focus and the other of said grids means being mounted so the pattern moving thereacross is outside nominal focus, and means for comparing the output of said modulation detectors to output a defocus signal.

* * * * *